(12) United States Patent
Lin et al.

(10) Patent No.: US 8,828,822 B2
(45) Date of Patent: Sep. 9, 2014

(54) METHOD FOR FABRICATING SEMICONDUCTOR DEVICE WITH REDUCED MILLER CAPACITANCE

(71) Applicant: Anpec Electronics Corporation, Hsin-Chu (TW)

(72) Inventors: Yung-Fa Lin, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 7 days.

(21) Appl. No.: 13/628,055

(22) Filed: Sep. 27, 2012

(65) Prior Publication Data
US 2014/0051220 A1 Feb. 20, 2014

(30) Foreign Application Priority Data

Aug. 17, 2012 (TW) .............................. 101129913 A

(51) Int. Cl.
*H01L 21/336* (2006.01)
(52) U.S. Cl.
USPC ......................................... 438/268

(58) Field of Classification Search
CPC ...................... H01L 29/7813; H01L 29/42368
See application file for complete search history.

(56) References Cited

U.S. PATENT DOCUMENTS

| | | | |
|---|---|---|---|
| 4,892,614 A * | 1/1990 | Chapman et al. | 438/425 |
| 6,852,597 B2 * | 2/2005 | Park et al. | 438/268 |
| 8,088,662 B2 * | 1/2012 | Yeh | 438/270 |
| 2008/0230801 A1 * | 9/2008 | Murakoshi et al. | 257/172 |
| 2010/0184268 A1 * | 7/2010 | Hirota | 438/400 |
| 2010/0327350 A1 * | 12/2010 | Loechelt et al. | 257/341 |
| 2013/0207188 A1 * | 8/2013 | Ervin et al. | 257/347 |

* cited by examiner

*Primary Examiner* — Mohsen Ahmadi
*Assistant Examiner* — Andre' C Stevenson
(74) *Attorney, Agent, or Firm* — Winston Hsu; Scott Margo

(57) ABSTRACT

A method for fabricating a semiconductor transistor device. An epitaxial layer is grown on a semiconductor substrate. A gate trench is formed in the epitaxial layer. A spacer is formed on a sidewall of the gate trench. A recess is formed at the bottom of the gate trench. A thermal oxidation process is performed to form an oxide layer in the recess. The oxide layer completely fills the recess. The spacer is then removed. A gate oxide layer is formed on the exposed sidewall of the gate trench. A gate is then formed into the gate trench.

9 Claims, 19 Drawing Sheets

(1)

METHOD FOR FABRICATING SEMICONDUCTOR DEVICE WITH REDUCED MILLER CAPACITANCE

BACKGROUND OF THE INVENTION

1. Field of the Invention

The present invention relates generally to the field of semiconductor technology. More particularly, the present invention relates to a method for fabricating a metal-oxide-semiconductor field-effect transistor (MOSFET) device with reduced Miller capacitance.

2. Description of the Prior Art

As known in the art, the rise of on-resistance of traditional planar power DMOS devices (DMOS) is contributed from the channel region, the accumulation layer and junction field effect transistor (JFET). In order to reduce the resistance of the above-mentioned area, trench type power devices (UMOS) are proposed. Since JFET region does not exist in a UMOS, the cell size can be reduced and the channel density is increased, thereby resulting in a lower on-resistance, but on the other hand, the UMOS devices has higher gate-to-drain capacitance (Miller capacitance) that affects the switching speed.

Therefore, one purpose of the present invention is to reduce the Miller capacitance of the power devices by incorporating a recess structure and by using an oxidation process to fill the recess. For the tight pitched structure, the oxidation process may have larger process window than the conventional deposition process. The disclosure can also be used in the fabrication process of a trench type transistor with superjunction structure and is capable of overcoming the difficulty of filling the high aspect ratio trenches.

SUMMARY OF THE INVENTION

One embodiment of the invention discloses a method for fabricating a semiconductor transistor device. An epitaxial layer is grown on a semiconductor substrate. A gate trench is formed in the epitaxial layer. A spacer is formed on a sidewall of the gate trench. A recess is formed at the bottom of the gate trench. A thermal oxidation process is performed to form an oxide layer in the recess. The oxide layer completely fills the recess. The spacer is then removed. A gate oxide layer is formed on the exposed sidewall of the gate trench. A gate is then formed into the gate trench.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-11 are schematic, cross-sectional diagrams illustrating a method for fabricating a semiconductor transistor device in accordance with one embodiment of the invention.

Figure 1:
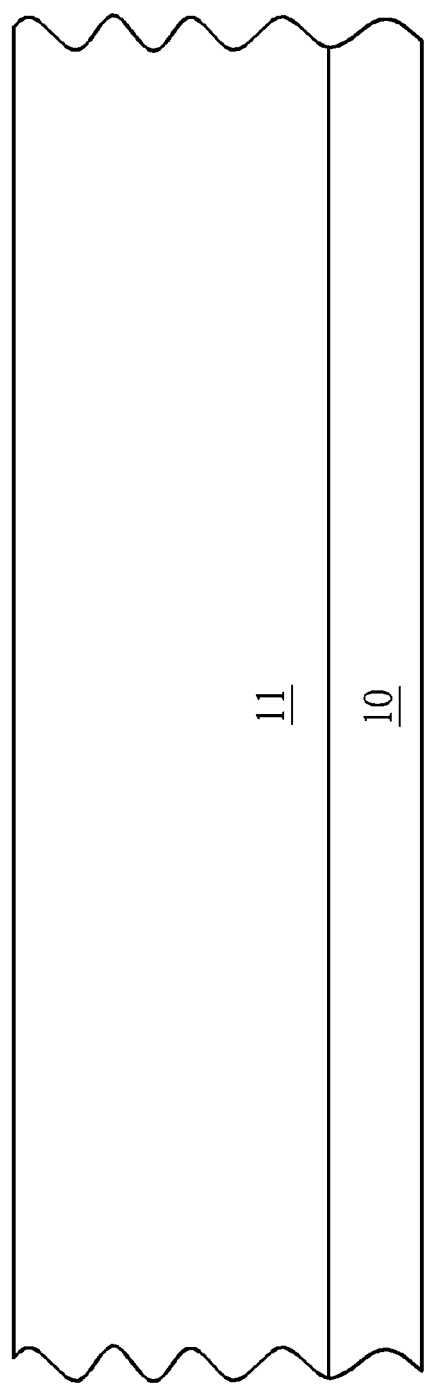
FIGS. 1-11 are schematic, cross-sectional diagrams illustrating a method for fabricating a semiconductor transistor device in accordance with one embodiment of the invention.

As shown in FIG. 1, a semiconductor substrate 10, such as an N type heavily doped silicon substrate, is provided. The semiconductor substrate 10 may act as a drain of the semiconductor transistor device. Subsequently, an epitaxial process is performed to form an epitaxial layer 11 such as an N type epitaxial silicon layer on the semiconductor substrate 10.

Figure 2:
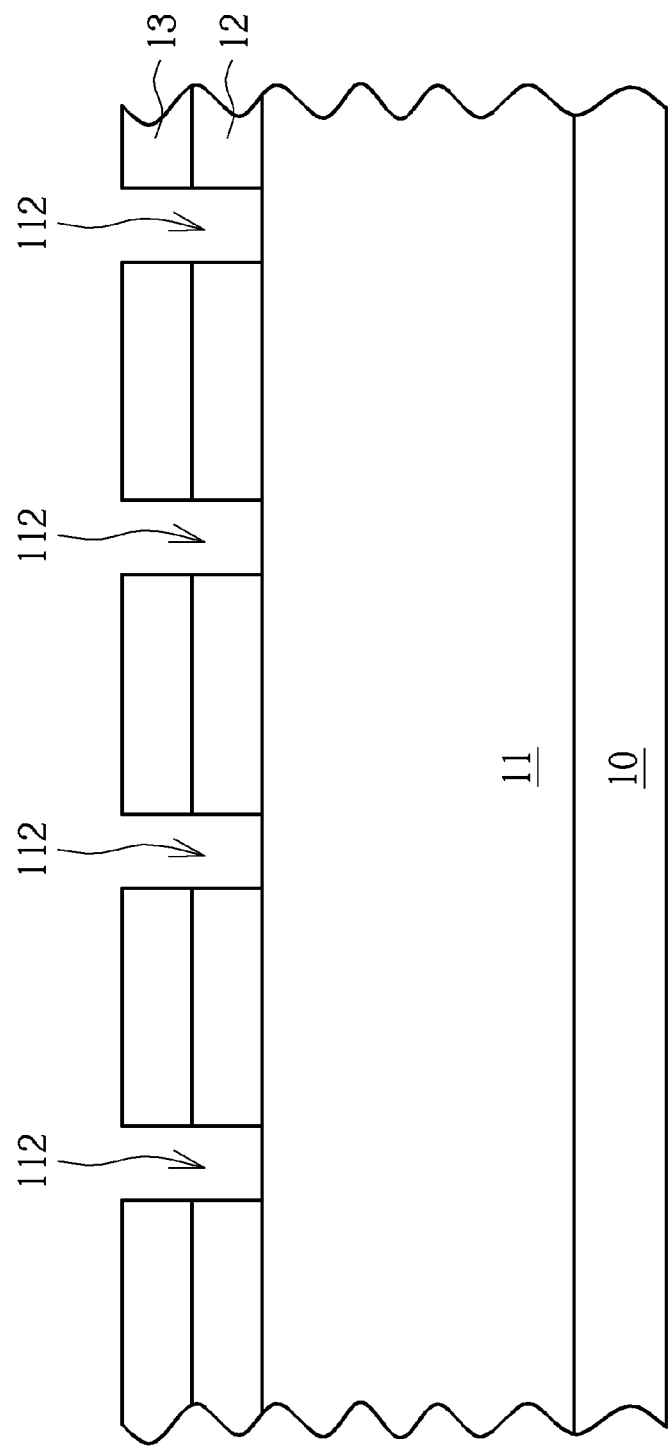

As shown in FIG. 2, a hard mask layer 12 is deposited on the epitaxial layer 11. For example, the hard mask layer 12 may comprise silicon oxide. Subsequently, a photoresist layer 13 is coated on the hard mask layer 12. A lithographic process and an etching process are performed to form openings 112 in the hard mask layer 12.

Figure 3:
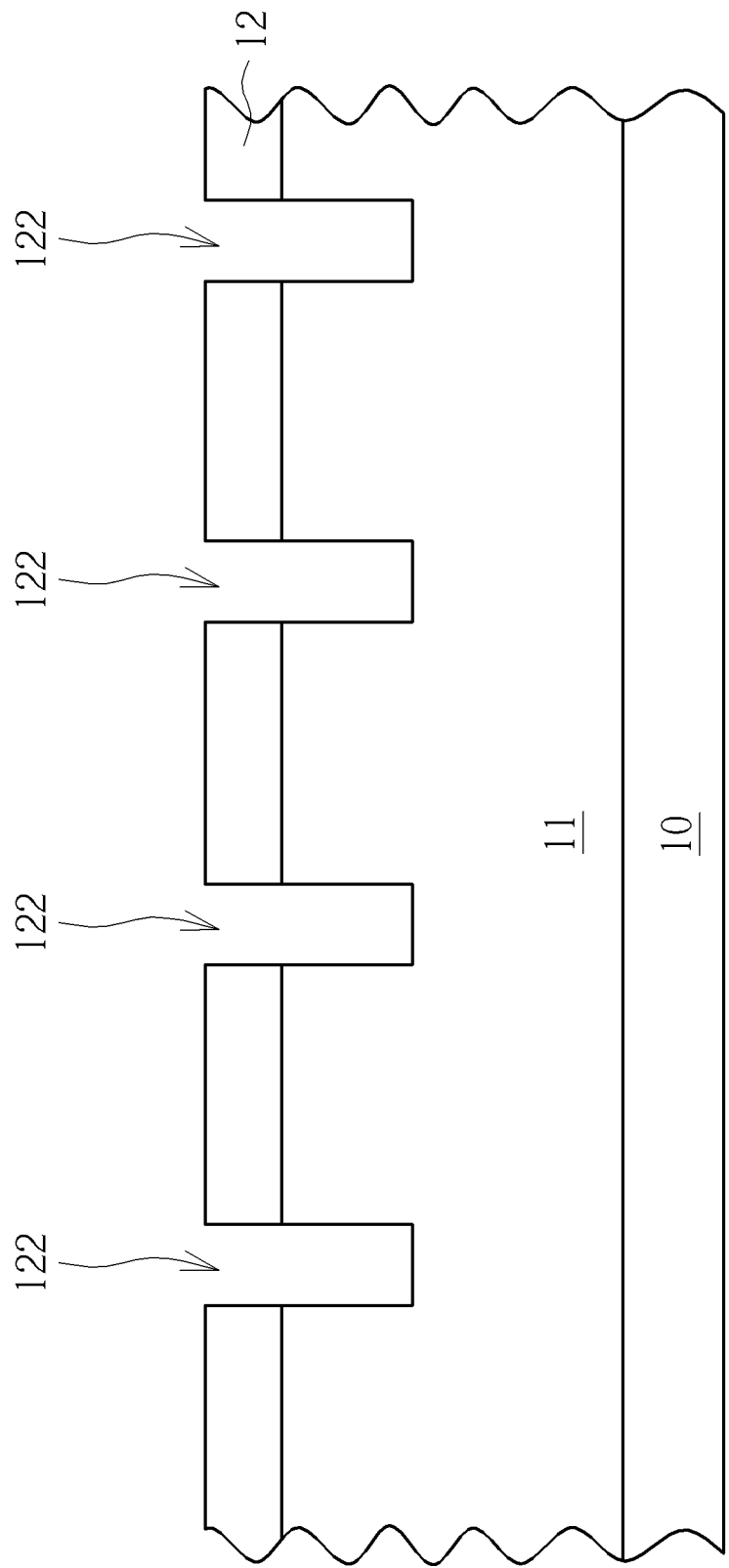

As shown in FIG. 3, the photoresist layer 13 is removed. Subsequently, a dry etching process is carried out to etch the epitaxial layer 11 to a predetermined first depth through the openings 112 in the hard mask layer 12, thereby forming gate trenches 122.

Figure 4:
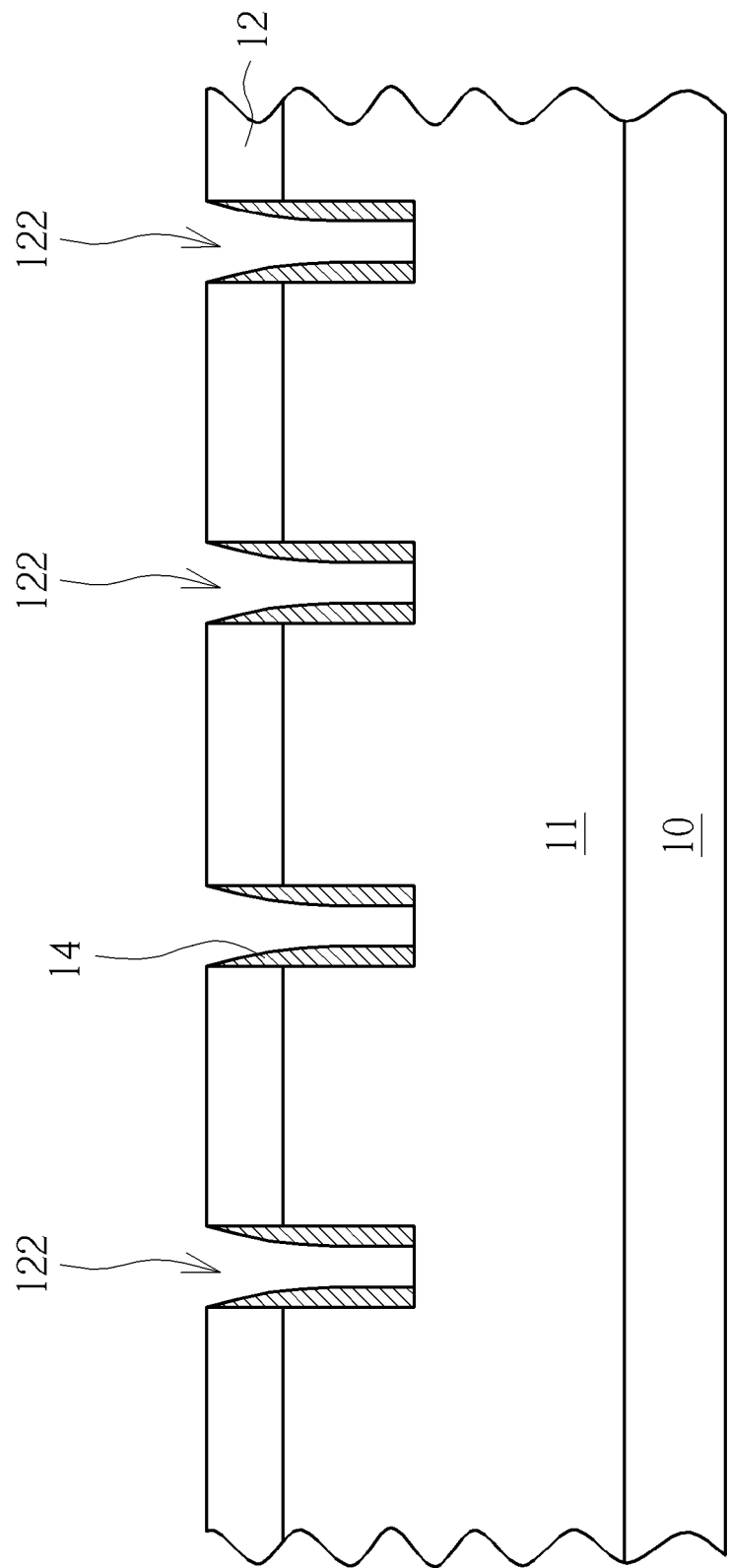

As shown in FIG. 4, a spacer 14 is formed on a sidewall of each of the gate trenches 122. For example, the spacer 14 may comprise silicon nitride. To form the spacer 14, first, a silicon nitride layer may be deposited, and then an anisotropic etching process may be carried out to etch the silicon nitride layer.

Figure 5:
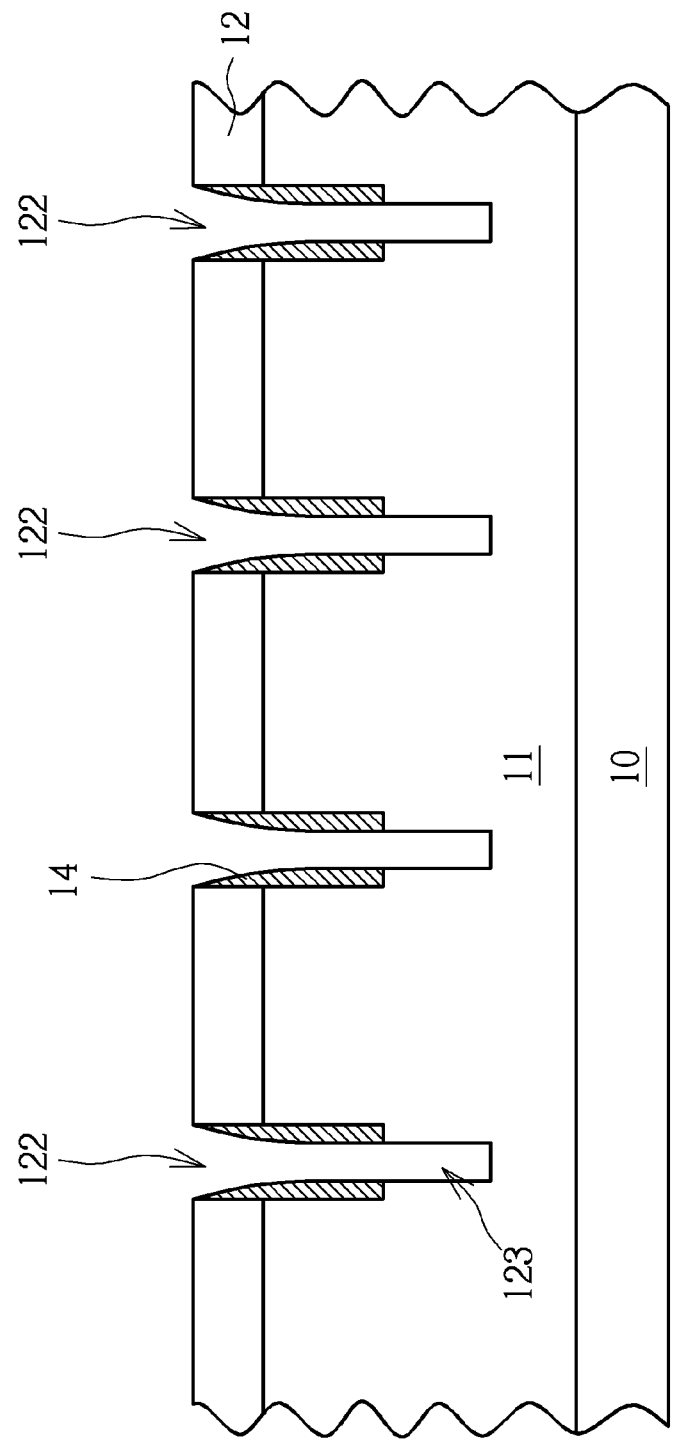

As shown in FIG. 5, a dry etching process is then performed, using the spacer 14 as an etching hard mask, to etch the epitaxial layer 11 to a predetermined second depth through the gate trenches 122, thereby forming recesses 123 directly under the gate trenches 122. The width of each of the recesses 123 may be controlled by the thickness of the spacer 14.

Figure 6:
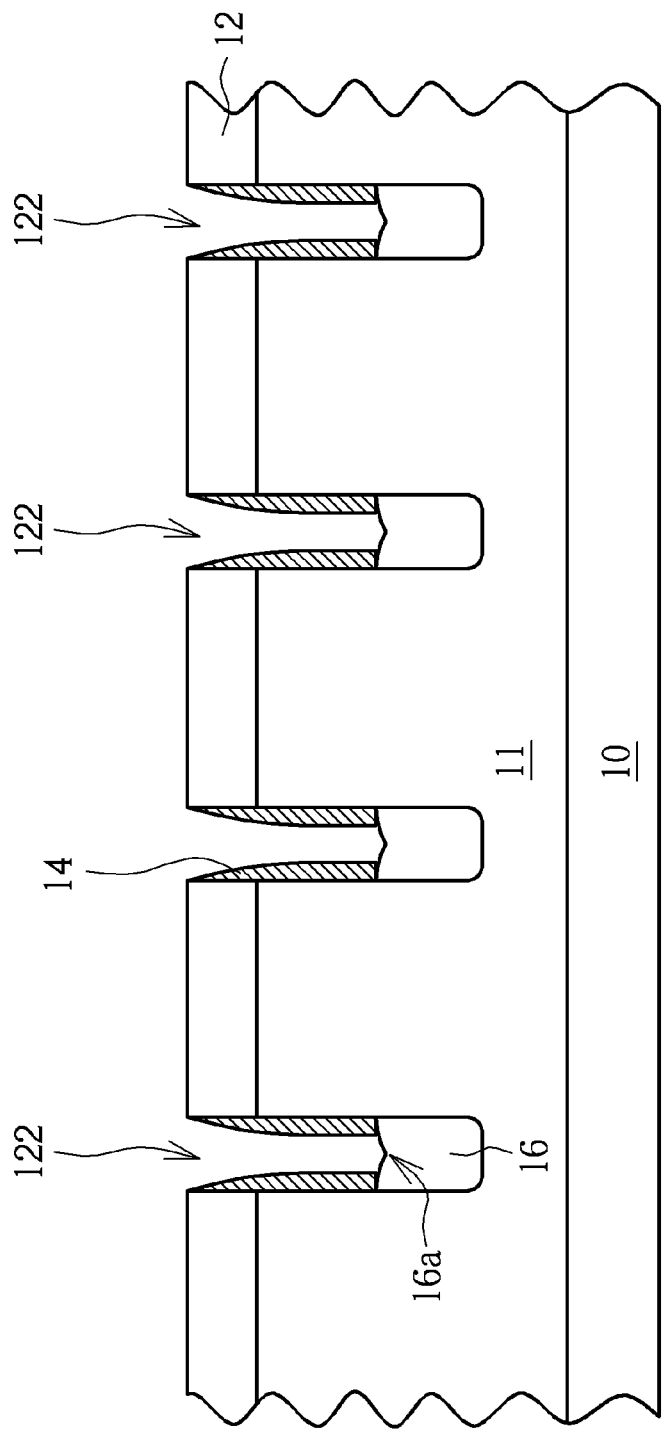

As shown in FIG. 6, a thermal oxidation process is then performed, for example, at temperatures between 800-1200° C. and under process pressure between 600-760 torr, by using water vapor, oxygen, or water vapor or oxygen containing a small amount of hydrogen chloride or nitrogen as reactant. At this point, the spacer 14 acts as a protection layer and the revealed epitaxial layer 11 inside the recesses 123 not covered by the spacer 14 is oxidized. After the thermal oxidation process is completed, the recesses 123 are filled with an oxide layer 16. As specifically indicated in FIG. 6, a wedge-shaped recess structure 16a is formed on a surface of the oxide layer 16.

Figure 7:
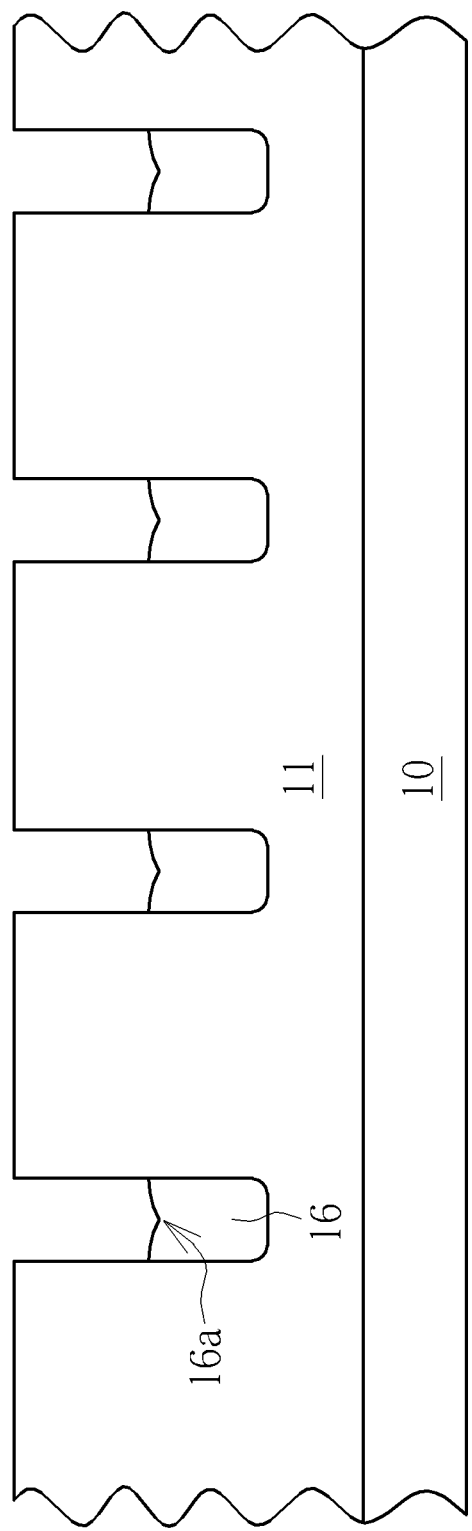

As shown in FIG. 7, after the formation of the oxide layer 16, the spacer 14 is removed from each of the gate trenches 122. The sidewall of each of the gate trenches 122 is revealed. Subsequently, the hard mask layer 12 is removed to reveal the surface of the epitaxial layer 11. To remove the hard mask layer 12, for example, a photoresist layer may be coated on the epitaxial layer 11 and may be filled into the gate trenches 122. The photoresist layer is then etched to expose the hard mask layer 12. After removing the hard mask layer 12, the photoresist layer is stripped off.

Figure 8:
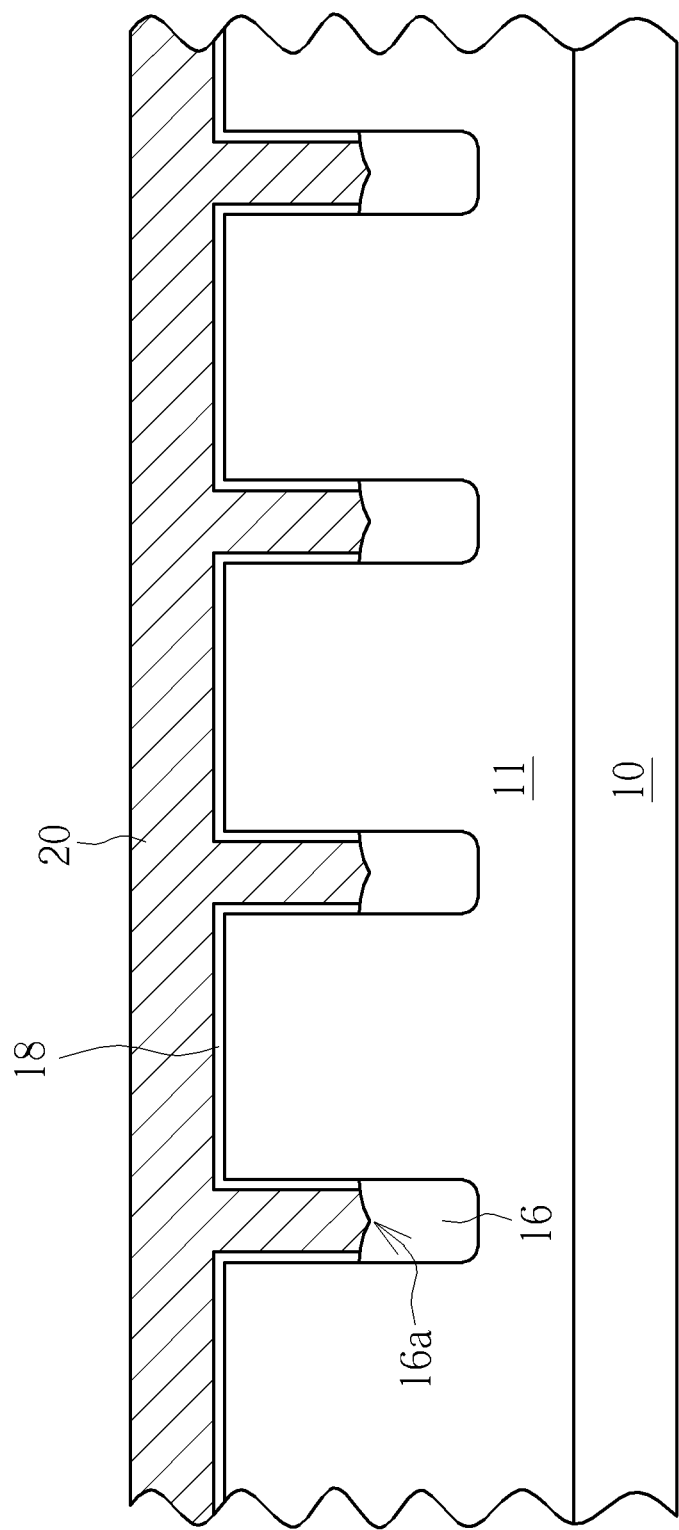

As shown in FIG. 8, a thermal oxidation process is carried out to form a gate oxide layer 18 on the exposed epitaxial layer 11 and the sidewall of each of the gate trenches 122. Subsequently, a chemical vapor deposition (CVD) process is performed to deposit a polysilicon layer 20 in a blanket manner. The polysilicon layer 20 fills the gate trenches 122.

Figure 9:
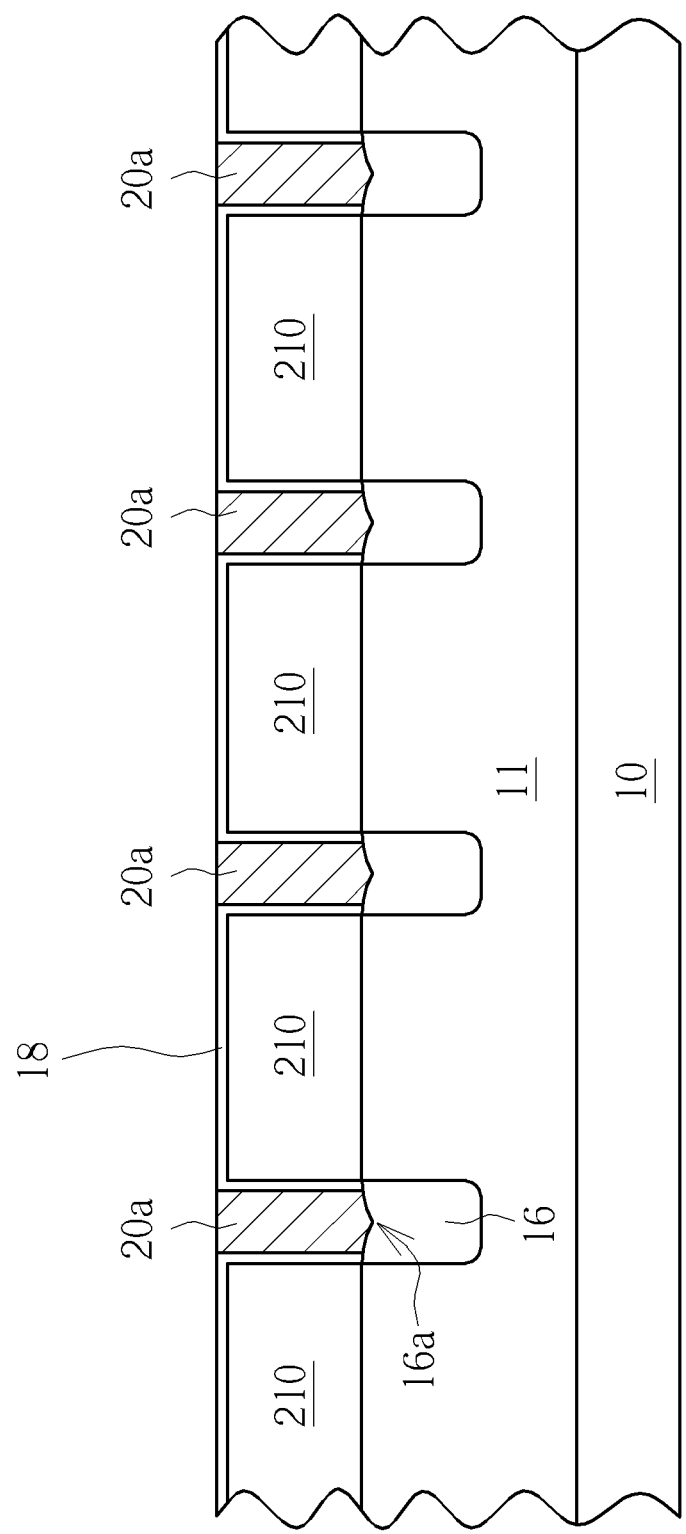

As shown in FIG. 9, an etching process may be performed to remove an upper portion of the polysilicon layer 20. The gate oxide layer 18 may be revealed. The remaining polysilicon layer 20 in the gate trenches acts as a trench gate 20a. Thereafter, an ion implantation process is carried out to form an ion well 210 in the epitaxial layer 11. For example, the ion well 210 may be P well.

Figure 10:
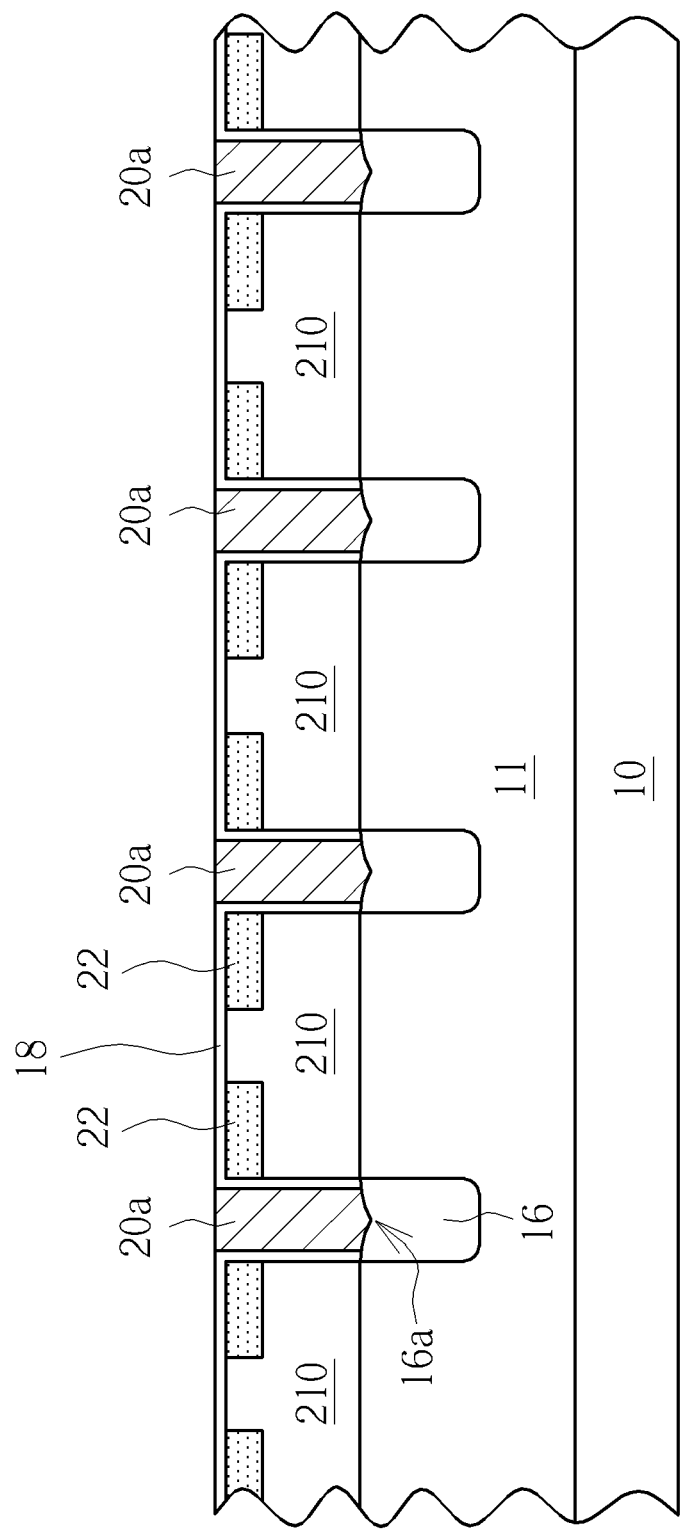

As shown in FIG. 10, a patterned photoresist layer (not shown) is then formed on the epitaxial layer 11 by using conventional lithographic process. The patterned photoresist layer defines the source region. An ion implantation process is carried out to implant dopants such as N type dopants into the source region defined by the patterned photoresist layer, thereby forming source doping region 22. Thereafter, the patterned photoresist layer is removed. A thermal drive-in process may be performed to activate the implanted dopants.

Figure 11:
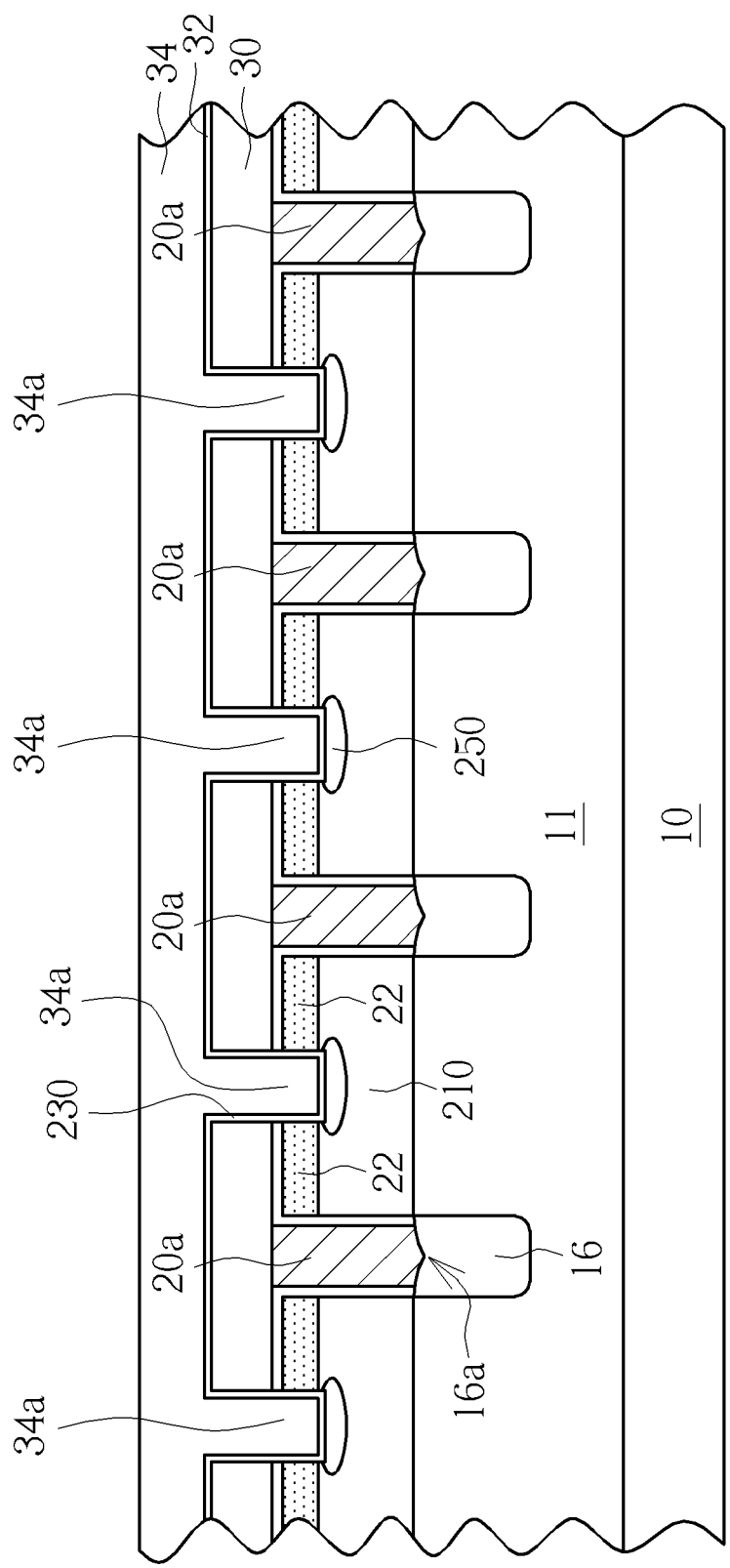

As shown in FIG. 11, contact holes are formed and metalized. To form the metalized contact holes, an inter-layer dielectric (ILD) layer 30 is first deposited. Then contact holes 230 are formed in ILD layer 30. Thereafter, contact doping region 250 is formed at the bottom of each of the contact holes 230. Barrier layer 32 and metal layer 34 are deposited to fill the contact holes 230, thereby forming the contact elements 34a.

Figure 12:
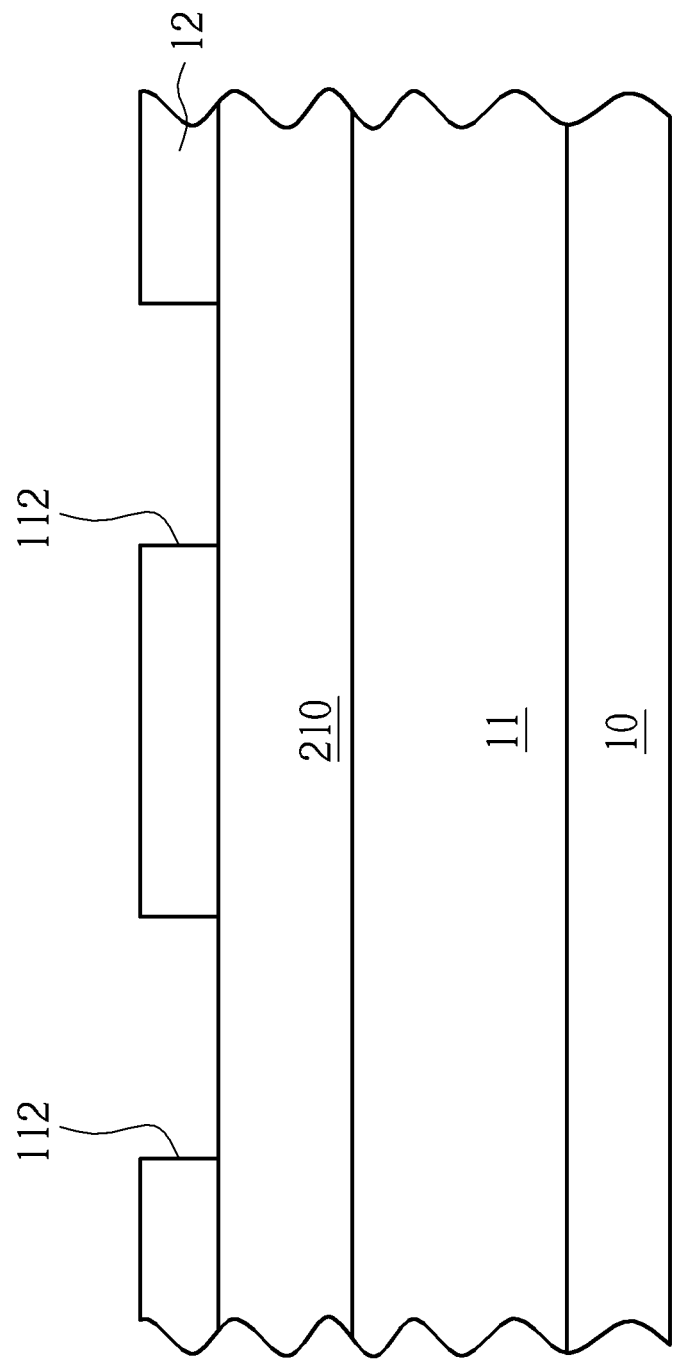
FIGS. 12-19 are schematic, cross-sectional diagrams illustrating a method for fabricating a semiconductor transistor device with a superjunction structure in accordance with one embodiment of the invention.

FIGS. 12-19 are schematic, cross-sectional diagrams illustrating a method for fabricating a semiconductor transistor device having superjunction structure in accordance with another embodiment of the invention, wherein like numeral numbers designate like layers, regions or elements. As shown in FIG. 12, a semiconductor substrate 10, such as an N type heavily doped silicon substrate, is provided. The semiconductor substrate 10 may act as a drain of the semiconductor transistor device. Subsequently, an epitaxial process is performed to form an epitaxial layer 11 such as a P type epitaxial silicon layer on the semiconductor substrate 10. An ion well 210 such as P well is formed in the epitaxial layer 11. A hard mask layer 12 is then formed on the epitaxial layer 11. The hard mask layer 12 comprises a plurality of openings 112 that expose a portion of the top surface of the epitaxial layer 11.

Figure 13:
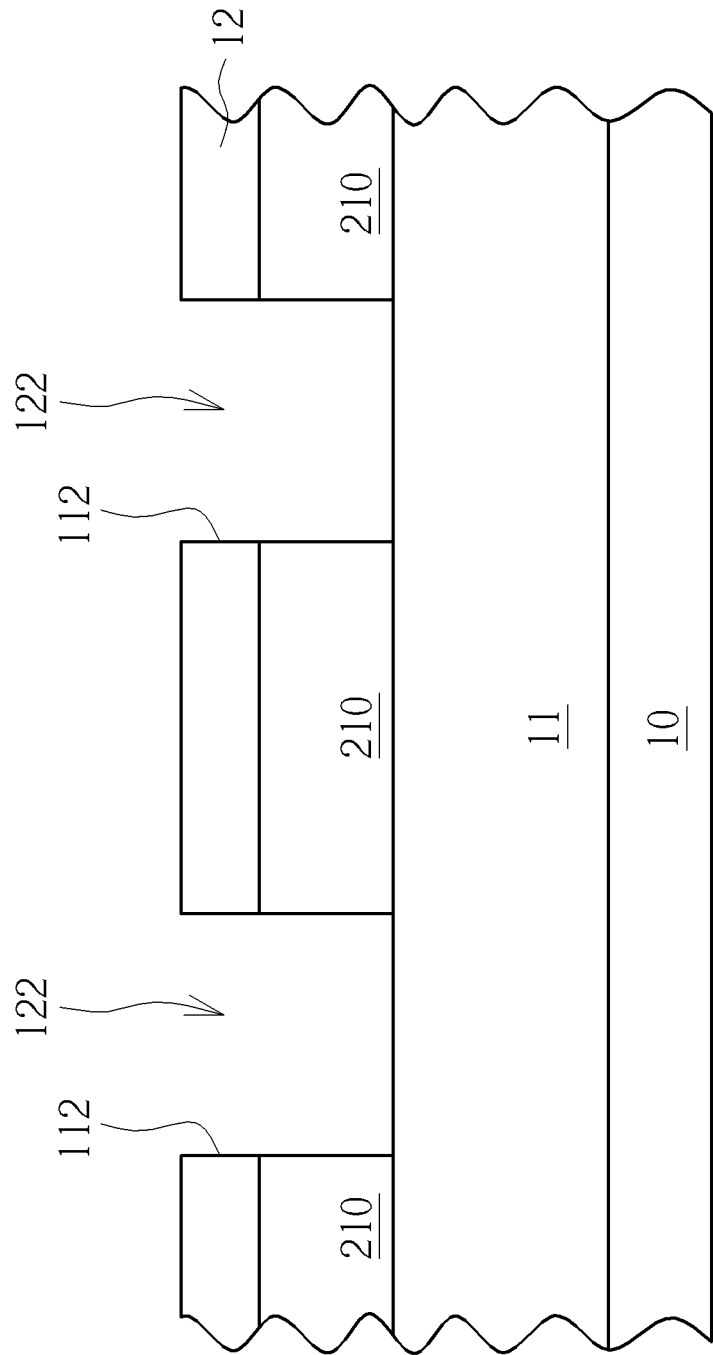

Subsequently, as shown in FIG. 13, a dry etching process is carried out to etch the epitaxial layer 11 to a predetermined first depth through the openings 112, thereby forming gate trenches 122.

Figure 14:
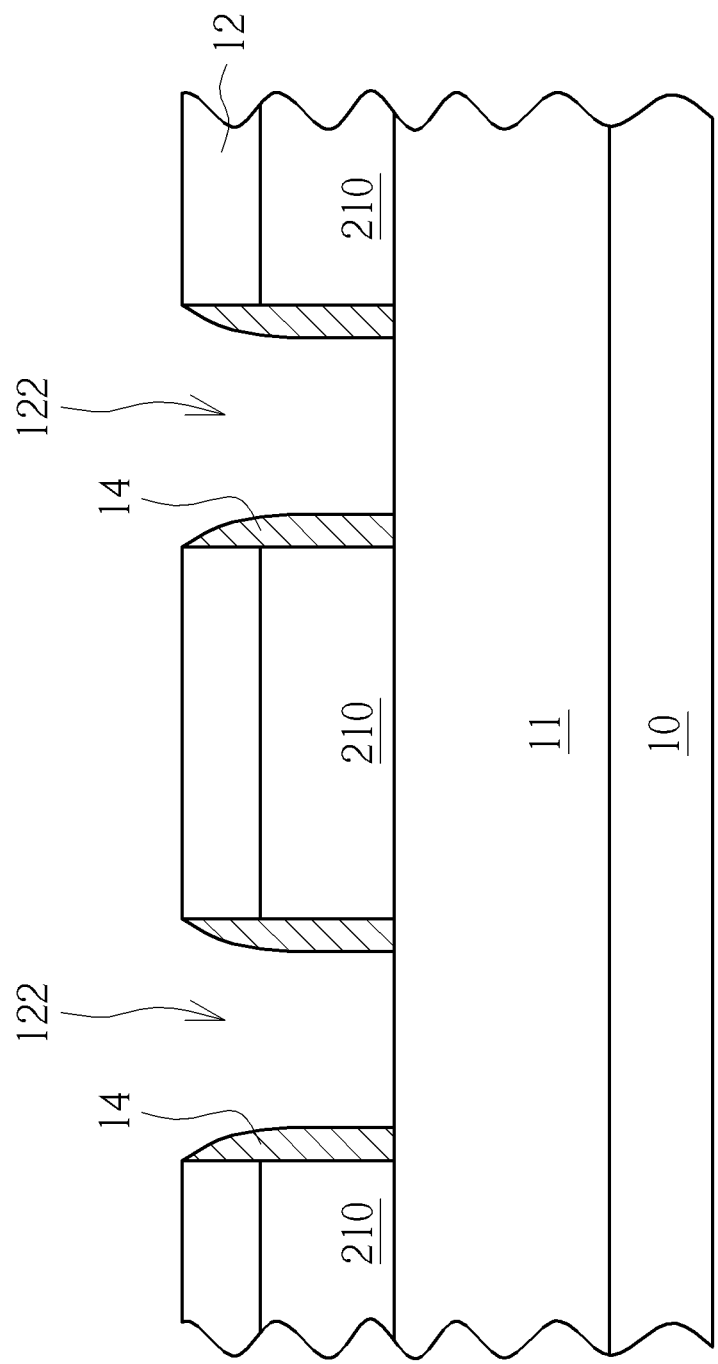

As shown in FIG. 14, a spacer 14 such as a silicon nitride spacer is formed on a sidewall of each of the gate trenches 122. To form the spacer 14, first, a silicon nitride layer may be deposited, and then an anisotropic etching process may be carried out to etch the silicon nitride layer.

Figure 15:
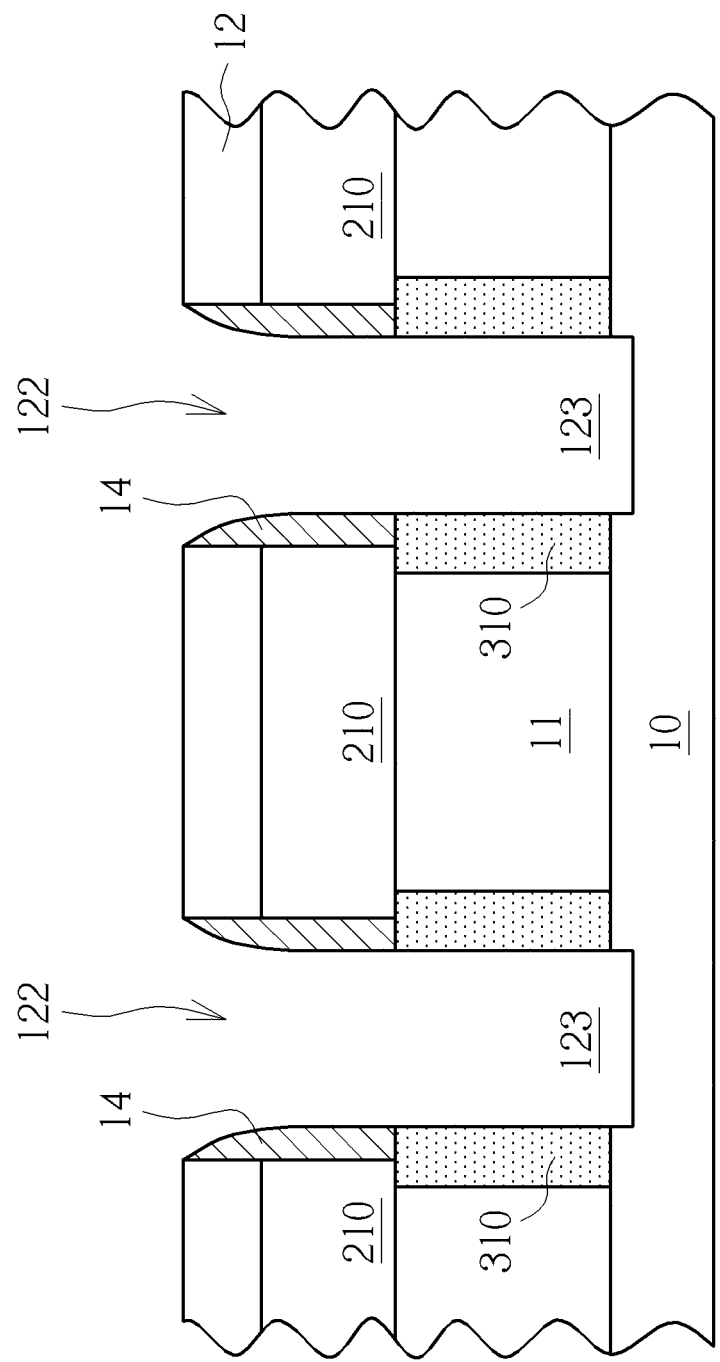

As shown in FIG. 15, a dry etching process is then performed, using the spacer 14 as an etching hard mask, to etch the epitaxial layer 11 to a predetermined second depth through the gate trenches 122, thereby forming recesses 123 directly under the gate trenches 122. The width of each of the recesses 123 may be determined by the thickness of the spacer 14. A body diffusion region 310 such as an N type body diffusion region is then formed in the epitaxial layer 11 through the recess 123 by using ay suitable diffusion methods. It is to be understood that the body diffusion region 310 may be formed in the epitaxial layer 11 before the formation of the spacer 14 by using ion implantation steps with different implant energies through the bottom of the gate trench 122.

Figure 16:
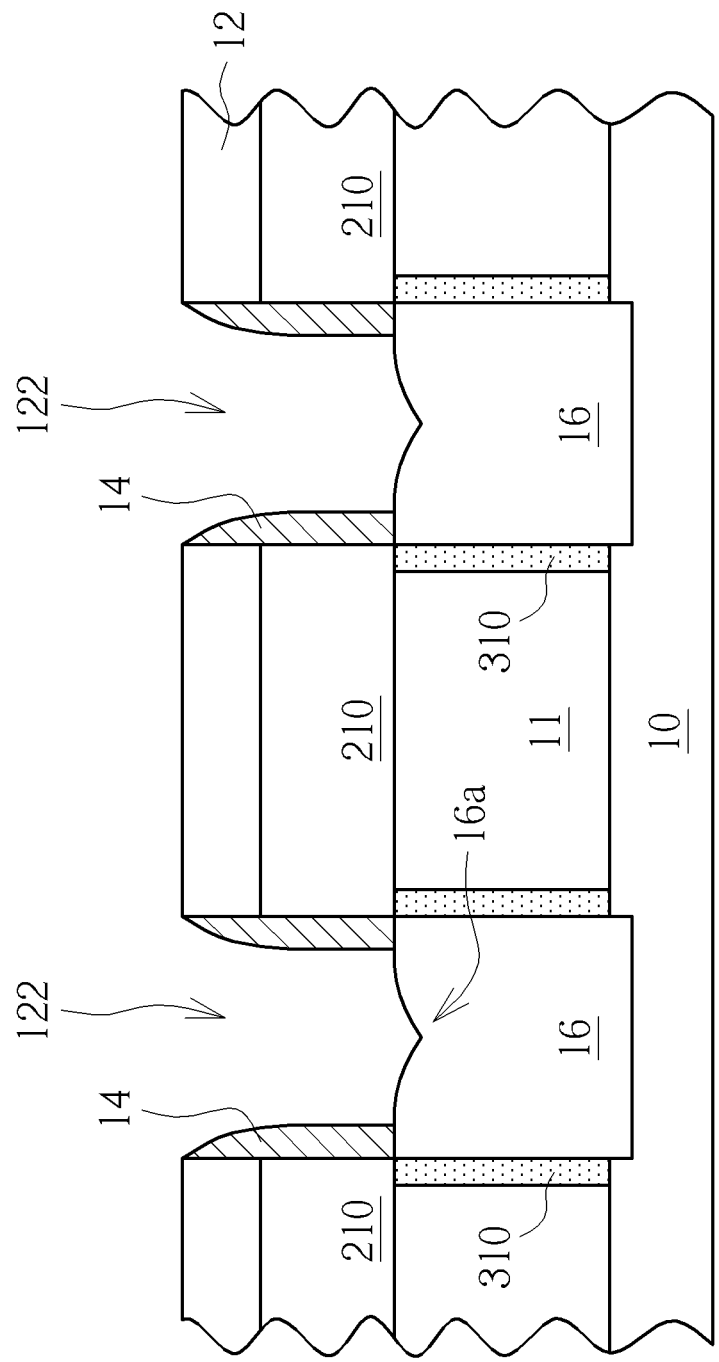

As shown in FIG. 16, a thermal oxidation process is then performed to oxidize epitaxial layer 11 inside the recesses 123 not covered by the spacer 14, thereby forming oxide layer 16. The spacer 14 acts as a protection layer during the thermal oxidation process. After the thermal oxidation process is completed, the recesses 123 are completely filled with the oxide layer 16. A wedge-shaped recess structure 16a is formed on a surface of the oxide layer 16.

Figure 17:
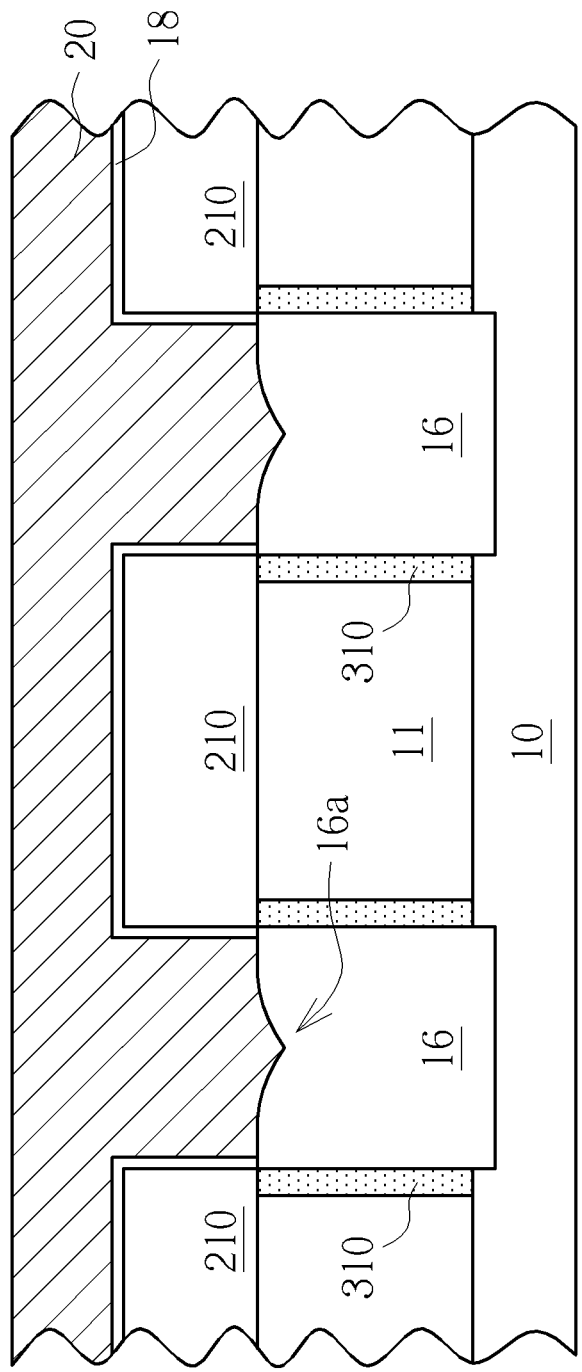

As shown in FIG. 17, after the formation of the oxide layer 16, the spacer 14 is removed from each of the gate trenches 122. The sidewall of each of the gate trenches 122 is revealed. Subsequently, the hard mask layer 12 is removed to reveal the surface of the epitaxial layer 11. Another thermal oxidation process is carried out to form a gate oxide layer 18 on the exposed epitaxial layer 11 and the sidewall of each of the gate trenches 122. Subsequently, a CVD process is performed to deposit a polysilicon layer 20 in a blanket manner. The polysilicon layer 20 fills the gate trenches 122.

Figure 18:
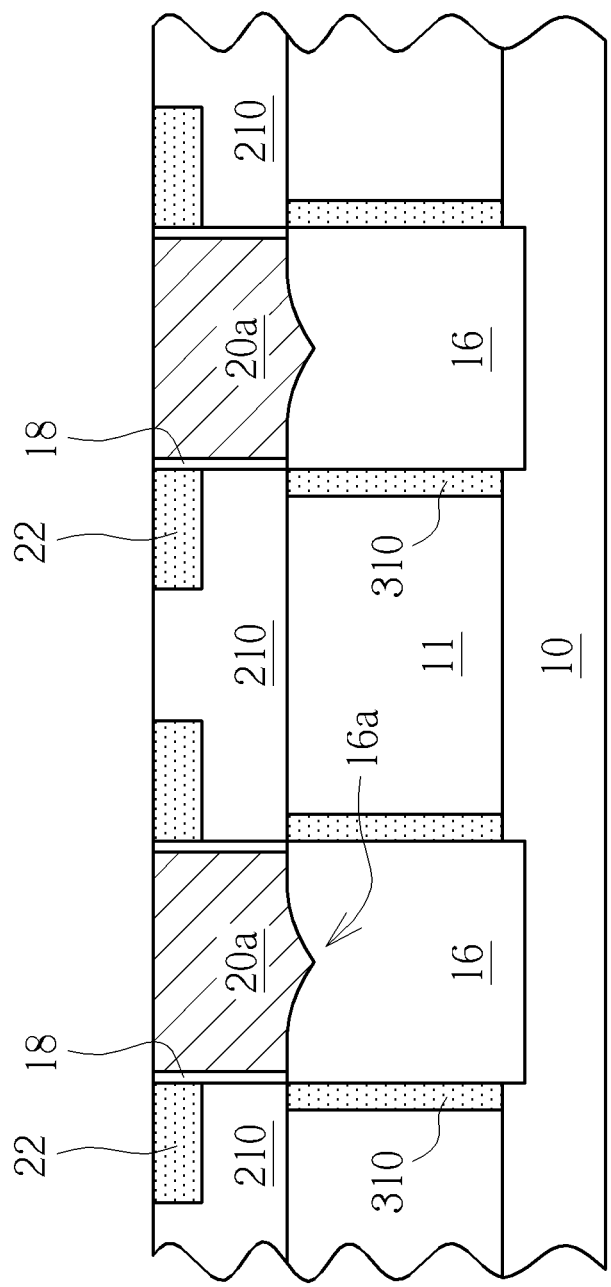

As shown in FIG. 18, an etching process or a polishing process may be performed to remove an upper portion of the polysilicon layer 20. The top surface of the epitaxial layer 11 may be revealed. The remaining polysilicon layer 20 in the gate trenches acts as a trench gate 20a that has a wedge-shaped bottom. Thereafter, an ion implantation process is carried out to implant dopants such as N type dopants into the source region, thereby forming source doping region 22.

Figure 19:
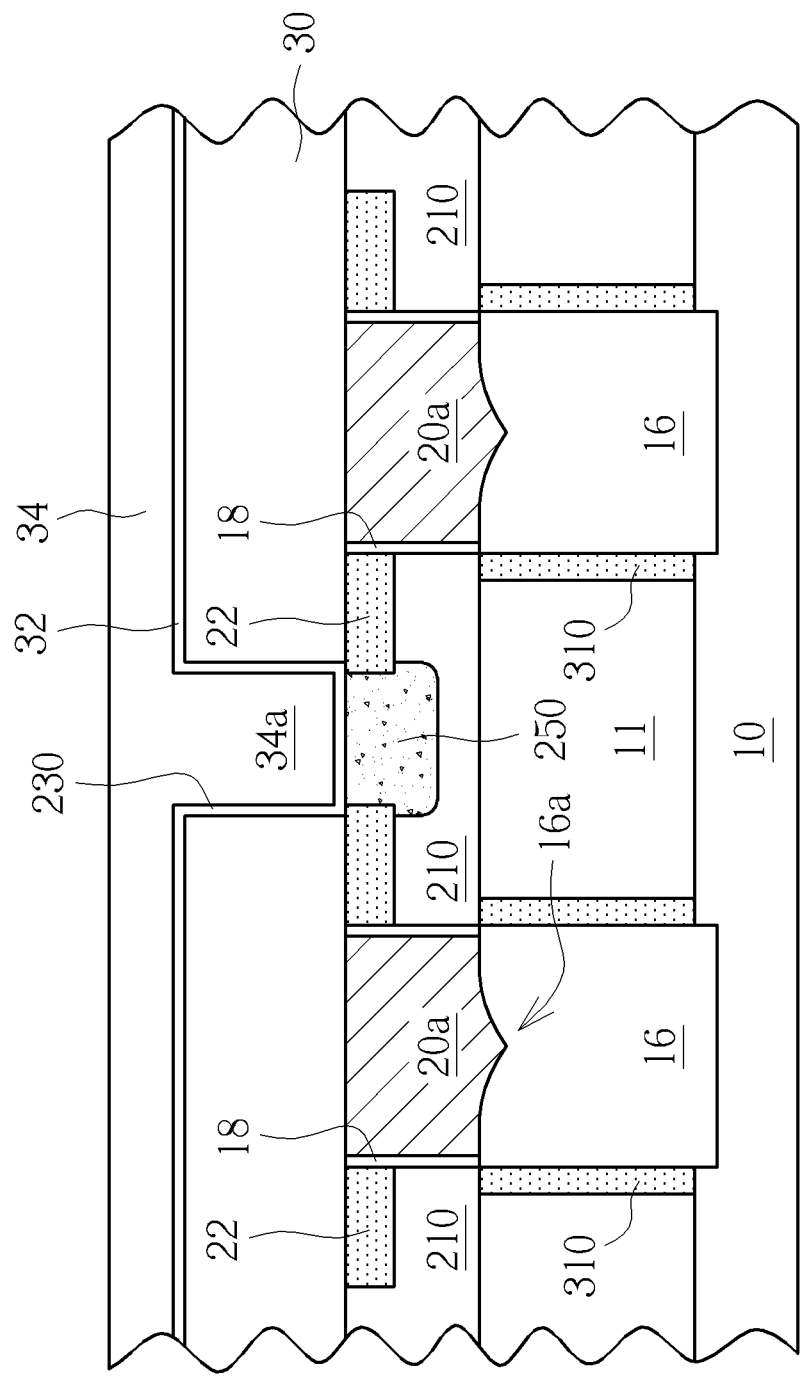

As shown in FIG. 19, contact holes are formed and metalized. To form the metalized contact holes, an ILD layer 30 is first deposited. Then contact holes 230 are formed in ILD layer 30. Thereafter, contact doping region 250 is formed at the bottom of each of the contact holes 230. Barrier layer 32 and metal layer 34 are deposited to fill the contact holes 230, thereby forming the contact elements 34a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor transistor device, comprising:
   providing a semiconductor substrate having a first conductivity type;
   forming an epitaxial layer on the semiconductor substrate;
   etching the epitaxial layer to thereby form a gate trench in the epitaxial layer;
   after forming the gate trench, forming a spacer on a sidewall of the epitaxial layer within the gate trench;
   etching the epitaxial layer from a bottom surface of the gate trench to form a recess underneath the gate trench;
   performing a thermal oxidation process to form an oxide layer that only fills up the recess;
   removing the spacer;
   forming a gate oxide layer on an exposed sidewall of the gate trench; and
   forming a gate in the gate trench.

2. The method for fabricating a semiconductor transistor device according to claim 1 wherein the thermal oxidation process is performed at temperatures between 800-1200° C. and under process pressure between 600-760 torr, by using water vapor, oxygen, or water vapor or oxygen containing a small amount of hydrogen chloride or nitrogen as reactant.

3. The method for fabricating a semiconductor transistor device according to claim 1 wherein the epitaxial layer has the first conductivity type.

4. The method for fabricating a semiconductor transistor device according to claim 1 wherein after forming the gate in the gate trench, the method further comprises:
   forming an ion well in the epitaxial layer, the ion well having a second conductivity type; and
   forming at least a source doping region in the ion well, the source doping region having the first conductivity type.

5. The method for fabricating a semiconductor transistor device according to claim 4 wherein the first conductivity type is N type and the second conductivity type is P type.

6. The method for fabricating a semiconductor transistor device according to claim 1 wherein after the recess is filled with the oxide layer, a wedge-shaped recess structure is formed on a surface of the oxide layer.

7. The method for fabricating a semiconductor transistor device according to claim 1 wherein the semiconductor substrate acts as a drain of the semiconductor transistor device.

8. The method for fabricating a semiconductor transistor device according to claim 1 wherein after forming the recess, the method further comprises:
   forming a body doping region in the epitaxial layer.

9. The method for fabricating a semiconductor transistor device according to claim 8 wherein the body doping region has the first conductivity type.

* * * * *